US006794309B2

(12) United States Patent
Liu et al.

(10) Patent No.: US 6,794,309 B2
(45) Date of Patent: Sep. 21, 2004

(54) METHOD FOR UTILIZING ROUGH INSULATOR TO ENHANCE METAL-INSULATOR-SEMICONDUCTOR RELIABILITY

(75) Inventors: Chee-Wee Liu, Taipei (TW); Fon Yuan, Taipei (TW); Chung-Hsun Lin, Taipei (TW)

(73) Assignee: National Taiwan University, Taipei (TW)

( * ) Notice: Subject to any disclaimer, the term of this patent is extended or adjusted under 35 U.S.C. 154(b) by 70 days.

(21) Appl. No.: 10/122,572

(22) Filed: Apr. 15, 2002

(65) Prior Publication Data

US 2003/0162409 A1 Aug. 28, 2003

(51) Int. Cl.[7] .................. H01L 21/31; H01L 21/469
(52) U.S. Cl. .................. 438/759; 438/765; 438/778
(58) Field of Search .................. 438/758, 765, 438/778, 759, 964

(56) References Cited

U.S. PATENT DOCUMENTS 5,837,581 A * 11/1998 Cheng .................. 438/225
6,060,355 A * 5/2000 Batra et al. .................. 438/225
6,268,615 B1   7/2001 Liu et al.

FOREIGN PATENT DOCUMENTS

TW          456057         6/1988

OTHER PUBLICATIONS

Tong and U. Gosele, "Semiconductor Wafer Bonding: Science and Technology," pp. 51–54, John Wiley & Sons, Inc., 1999.

* cited by examiner

Primary Examiner—Alexander Ghyka
(74) Attorney, Agent, or Firm—Volpe and Koenig, P.C.

(57) ABSTRACT

A method for utilizing a rough insulator to enhance metal-insulator-semiconductor reliability is provided. The method includes steps of: (a) providing a semiconductor substrate; (b) prebaking the semiconductor substrate under a relatively high vacuum to form a rough surface on the semiconductor substrate; and (c) growing an insulator on the semiconductor substrate to form a rough insulator and increase the metal-insulator-semiconductor reliability when the insulator is applied.

9 Claims, 7 Drawing Sheets

METHOD FOR UTILIZING ROUGH INSULATOR TO ENHANCE METAL-INSULATOR-SEMICONDUCTOR RELIABILITY

FIELD OF THE INVENTION

This invention relates to a method for enhancing the insulator reliability, and more particularly to a method for utilizing the rough insulator to enhance the metal-insulator-semiconductor reliability.

BACKGROUND OF THE INVENTION

Because of the progress of the semiconductor industry, the thickness of the insulator of the semiconductor devices becomes thinner and thinner, and the thickness of the insulator might be less than 2 nm. When the devices are operated under the situation described above, the insulator will be degraded because of the electrical stress, and then stress induced leakage current (SILC) or soft breakdown caused by the electrical stress occurred.

Besides, among the new patterned devices which utilize tunneling current, such as metal insulator semiconductor light emitted diode (MISLED, Taiwanese Patent No. 456057) and metal insulator semiconductor photodetector (U.S. Pat. No. 6,268,615B1), both have to solve the problem about insulator reliability.

Because of the technical problems described above, the applicant keeps on carving unflaggingly to develop "the method for utilizing the rough insulator to enhance the metal-insulator-semiconductor reliability" through wholehearted experience and research.

SUMMARY OF THE INVENTION

It is an object of the present invention to provide a method to increase the roughness of the interface between the insulator and the semiconductor to enhance the metal-insulator-semiconductor reliability.

It is another object of the present invention to provide a rough surface of the insulator to reduce the energy of the tunneling carriers, thus enhance the metal-insulator-semiconductor reliability and extend the time limit of the devices.

The present invention provides a method for utilizing a rough insulator to enhance metal-insulator-semiconductor reliability includes steps of: (a) providing a semiconductor substrate; (b) prebaking the semiconductor substrate under a relatively high vacuum to form a rough surface on the semiconductor substrate; and (c) growing an insulator on the semiconductor substrate to from a rough insulator and increase the metal-insulator-semiconductor reliability when the insulator is applied thereto.

Preferably, the semiconductor substrate is made of a material selected from a group consisting of silicon, germanium, silicon-germanium substrate and III–V group.

Preferably, the semiconductor substrate is made of a material selected from a group consisting of single-crystal silicon, polysilicon, amorphous silicon, and epitaxial growth.

Preferably, the semiconductor substrate is one of P-type and N-type.

Preferably, the step (b) further comprises a step of (b1) purifying the semiconductor substrate via introducing hydrogen.

Preferably, the step (b) is executed at a prebaking temperature ranged from 700 to 1000° C., a prebaking pressure less than $10^{-4}$ torr, and a prebaking time ranged from 1 to 60 minutes.

Preferably, the step (c) is executed by a growing method selected from a group consisting of furnace oxidation, rapid thermal oxidation, chemical vapor deposition, and anodic oxidation.

Preferably, the step (c) is formed by reacting with a material selected from a group consisting of gas, liquid, and solid.

Preferably, the insulator is a dielectric.

Preferably, the dielectric is selected from a group consisting of silicon dioxide ($SiO_2$), silicon nitride ($Si_3N_4$), silicon oxynitride ($SiO_xN_y$), and high-K materials.

In accordance with an aspect of the present invention, a method for utilizing a rough insulator to enhance metal-insulator-semiconductor reliability includes steps of: (a) providing a semiconductor substrate; (b) processing the semiconductor substrate by a chemical process to form a rough surface on the semiconductor substrate; and (c) growing an insulator on the semiconductor substrate to form a rough insulator and increase the metal-insulator-semiconductor reliability when the insulator is applied thereto.

Preferably, the chemical process in step (b) is a refined SC1 (Standard Clean-1, $NH_4OH$, $H_2O_2$, $H_2O$) chemical process (Q.-Y. Tone and U. Gosele. "Semiconductor Wafer Bonding: Science and Technology." pp. 51–54, John Wiley & Sons, INC., 1999.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

A preferable embodiment according to the present invention is illustrated through the N-type silicon substrate. Before growing the insulator, first we prebake the silicon wafer under a relatively high temperature (900~1000° C.) and a relatively high vacuum (about $10^{-6}$ torr), and utilizing the technology of rapid thermal oxidation to grow an insulator having the thickness of 1~3 nm. Deposit the metal aluminum onto the insulator and then utilizing photolithography and wet etching to manufacture the P-type metal oxide semiconductor (PMOS). The area of the aluminum electrode is about $3 \times 10^{-4}$ $cm^{-2}$.

Another preferable embodiment according to the present invention is illustrated with the N-type silicon wafer. After using the hydrofluoric acid (HF) to clean the native oxide of the N-type silicon wafer, the wafer is carried into the growing system wherein the temperature is raised to 1000° C., the pressure is maintained at $10^{-6}$ torr, and the prebaking time is one minute. Then, hydrogen is introduced, the pressure is maintained at 100 mbar, and the prebaking time is one minute. Subsequently, after introducing nitrogen to clean for ten minutes, the temperature is raised to 1000° C., oxygen and nitrogen are introduced, the pressure is 100 mbar and the growth of the insulator continues for thirty seconds and then cleaning by nitrogen for ten minutes. Finally, the temperature is raised to 900° C. and the pressure is maintained at 100 mbar with nitrogen to anneal for ten minutes to obtain a better insulator reliability.

Figure 1:
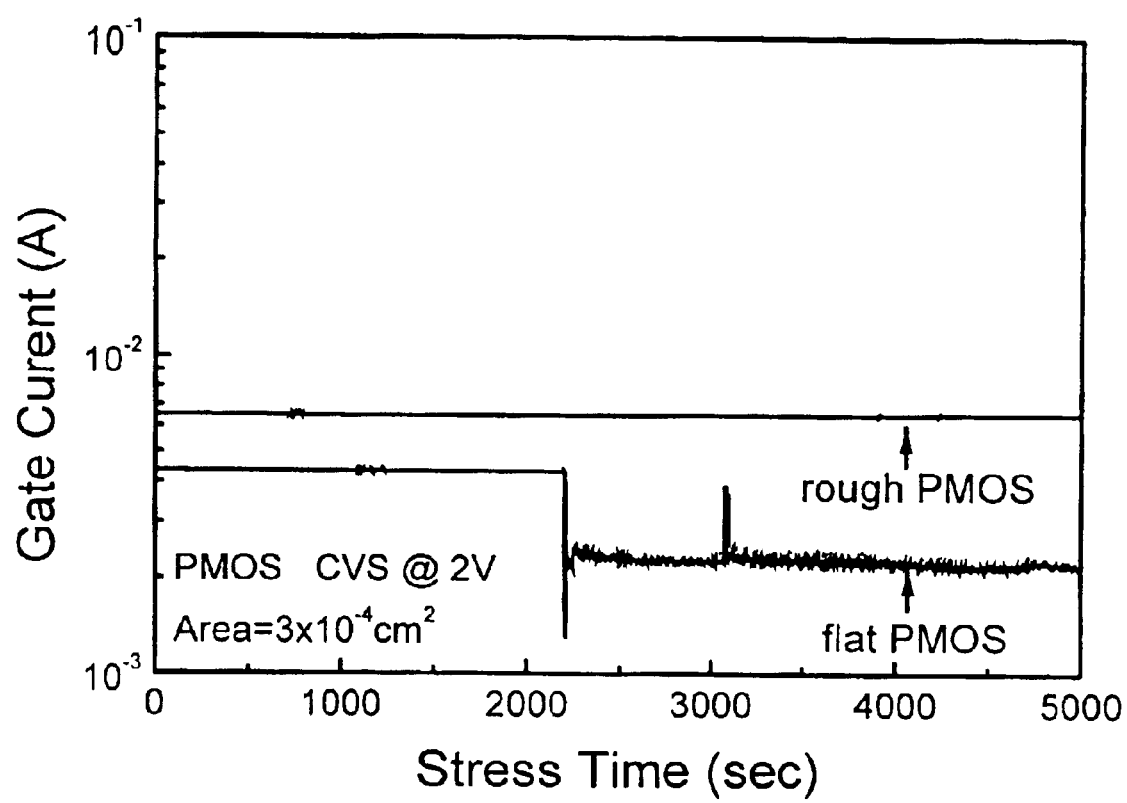
FIG. 1 is the comparative plot of the variations of the gate currents of the traditional device having an insulator with a flat surface and the present device with a relatively rougher surface when both applied with a 2V constant voltage stress.
Figure 2A:
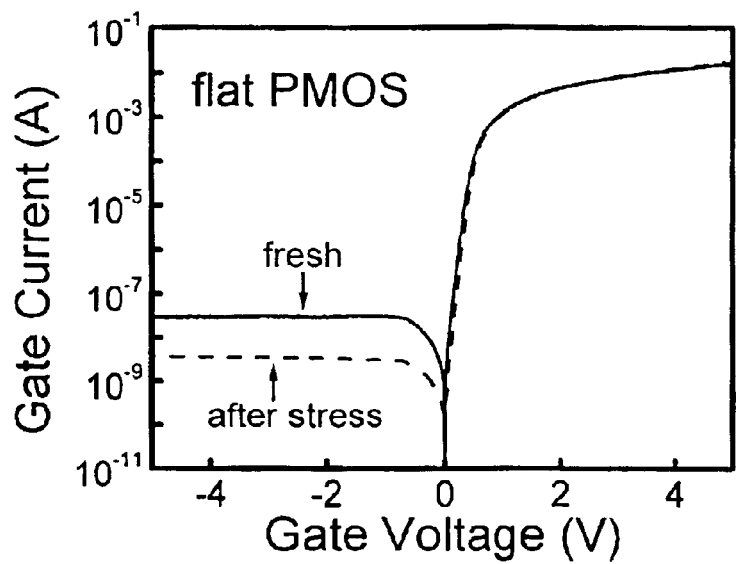
FIG. 2A is the I–V curve before and after applying the constant voltage stress to the flat PMOS according to the present invention.
Figure 2B:
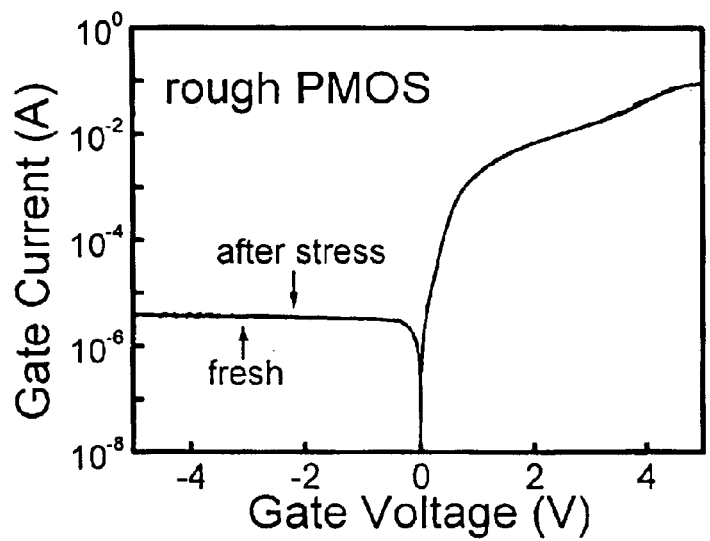
FIG. 2B is the I–V curve before and after applying the constant voltage stress to the rough PMOS according to the present invention.

Please refer to FIG. 1 showing the comparative plot of the variations of the gate currents of the traditional device having an insulator with a flat surface and the present device with a relatively rougher surface when both applied with a 2V constant voltage stress. FIG. 2A is the I–V curve before and after applying the voltage to the flat PMOS. FIG. 2B is the I–V curve before and after applying the voltage to the rough PMOS. The gate is treated by the constant voltage stress to show the relationship between the gate voltage and the current before and after the device is treated by the current stress. As shown in these figures, under the constant voltage stress, the soft breakdown is appeared to the traditional device having the insulator with flat surface at about 2200 seconds. But the soft breakdown is not appeared to the present insulator with relatively rougher surface in 5000 seconds under the same constant voltage stress.

Figure 3:
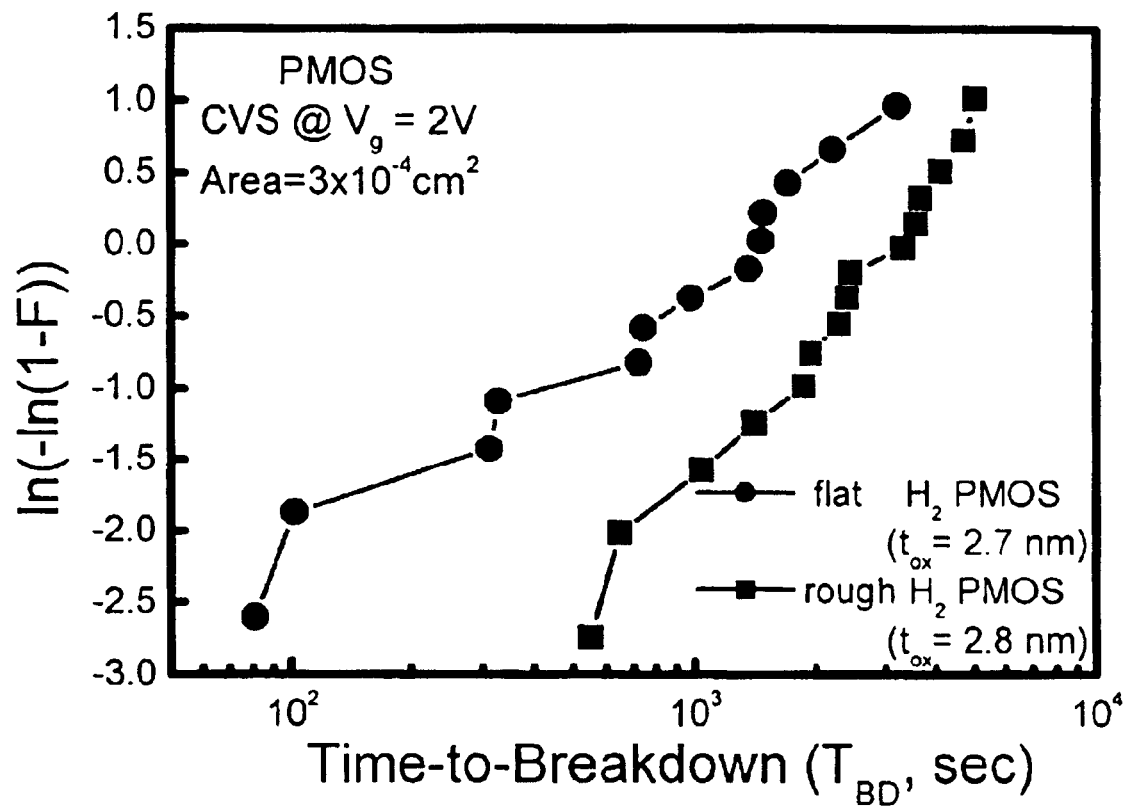
FIG. 3 is a Weibull-Plot of the flat and the rough PMOS LED (wherein F is the failure rate of the device) according to the present invention.

Please refer to FIG. 3 showing the time dependent dielectric breakdown plots of two kinds of PMOS devices, wherein F is the failure rate of the device. In FIG. 3, the insulator with a relatively rougher surface (where roughness is about 1.45 nm) and the insulator with a relatively flatter surface (where the roughness is about 0.15 nm) are applied with 2V constant voltage stress and the time to breakdown ($T_{BD}$) of the devices is gathered statistically. The device with relatively high vacuum prebake and relatively rougher surface obviously has a higher $T_{BD}$ compared to the traditional device with a flat surface. In other words, the surface roughness increases the insulator reliability in PMOS devices.

Figure 4:
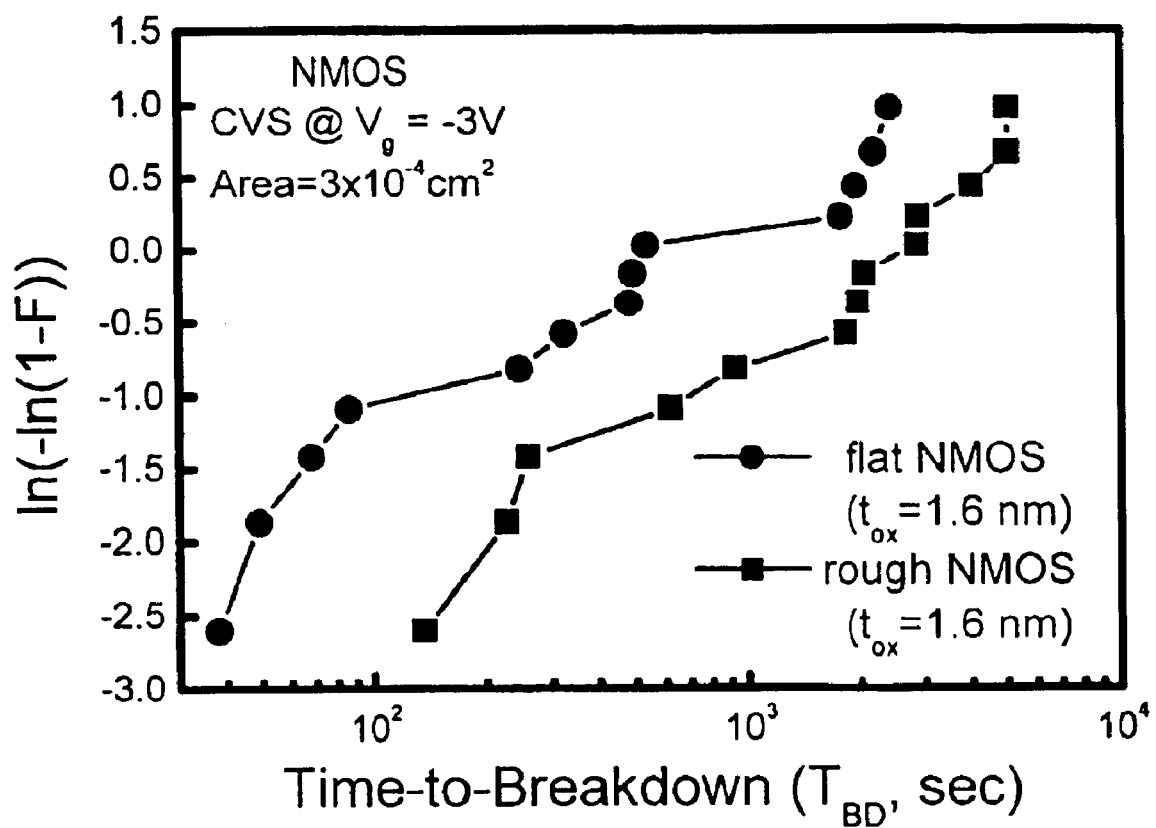
FIG. 4 is a Weibull-Plot of the flat and the rough NMOS LED (wherein F is the failure rate of the device) according to the present invention.

Please refer to FIG. 4 showing the time dependent dielectric breakdown plots of two kinds of NMOS devices, wherein F is the failure rate of the device. In FIG. 4, the insulator with a relatively rougher surface (where roughness is about 0.85 nm) and the insulator with a relatively flatter surface (where the roughness is about 0.06 nm) are applied with −3V constant voltage stress and the time to breakdown ($T_{BD}$) of the devices is gathered statistically. The device with relatively high vacuum prebake and relatively rougher surface obviously has a higher $T_{BD}$ compared to the traditional device with a flat surface. In other words, the surface roughness increases the insulator reliability in NMOS devices.

Figure 5:
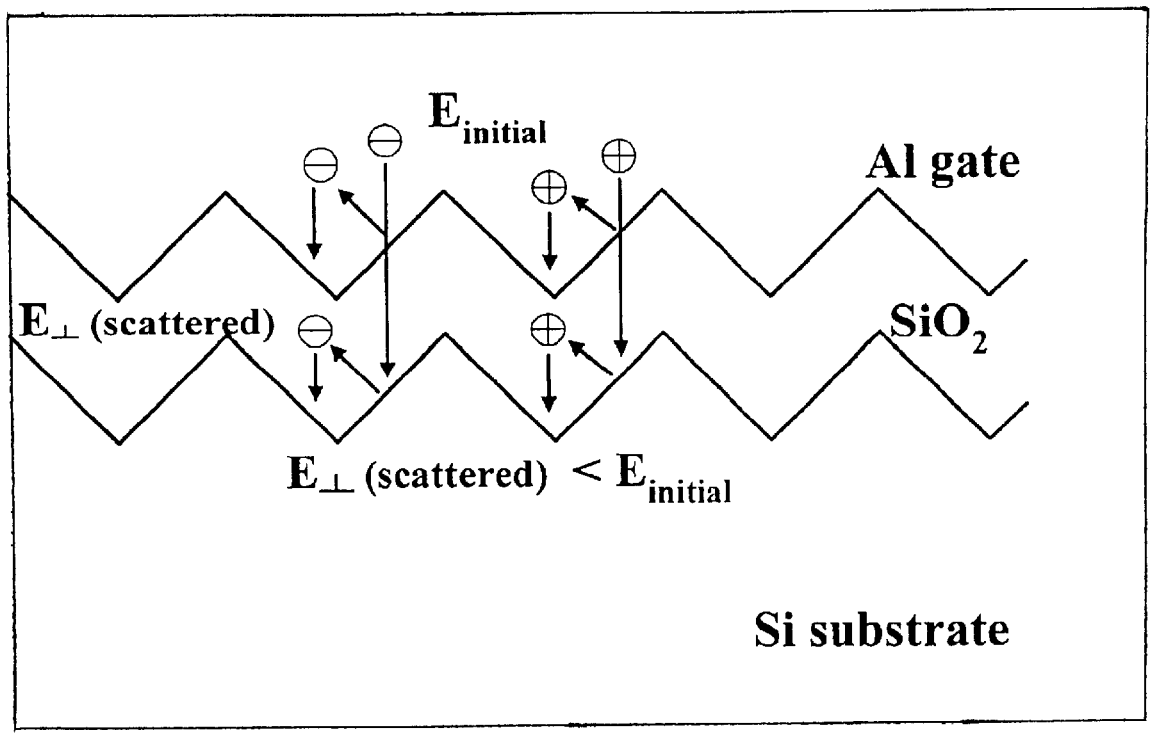
FIG. 5 is the theoretical of plot improving the insulator reliability through the roughness according to the present invention. The impact energy perpendicular to the $Si/SiO_2$ of electron or hole is reduced due to the surface and interface roughness scattering.

Please refer to FIG. 5 showing the theoretical of plot improving the insulator reliability through the roughness according to the present invention. The carriers tunneling the insulator are scattered due to the rough surface, and also the initial carrier energy ($E_{initial}$) is reduced to $E_\perp$ (scattered), so that the traps are more difficult to form in the insulator and the reliability of the insulator is increased. In a PMOS, when the insulator is so thin that the tunneling current occurs and the traps form when the electric holes are tunneling the insulator. When the traps in the insulator reach a specified amount, the soft breakdown will be appeared. For the electric holes, if the insulator surface the electric holes tunnel has a rough surface, the electric holes will be scattered and the energy on the surface perpendicular to the insulator surface will be reduced. Thus, the traps in the insulator are difficult to be formed and the soft breakdown will also hardly appear. That's means that the roughness enhances the insulator reliability and enhance the durability of the devices. For an N-type metal-insulator semiconductor (NMOS), the theorem is the same, but at this time the carrier is the electron.

Figure 6:
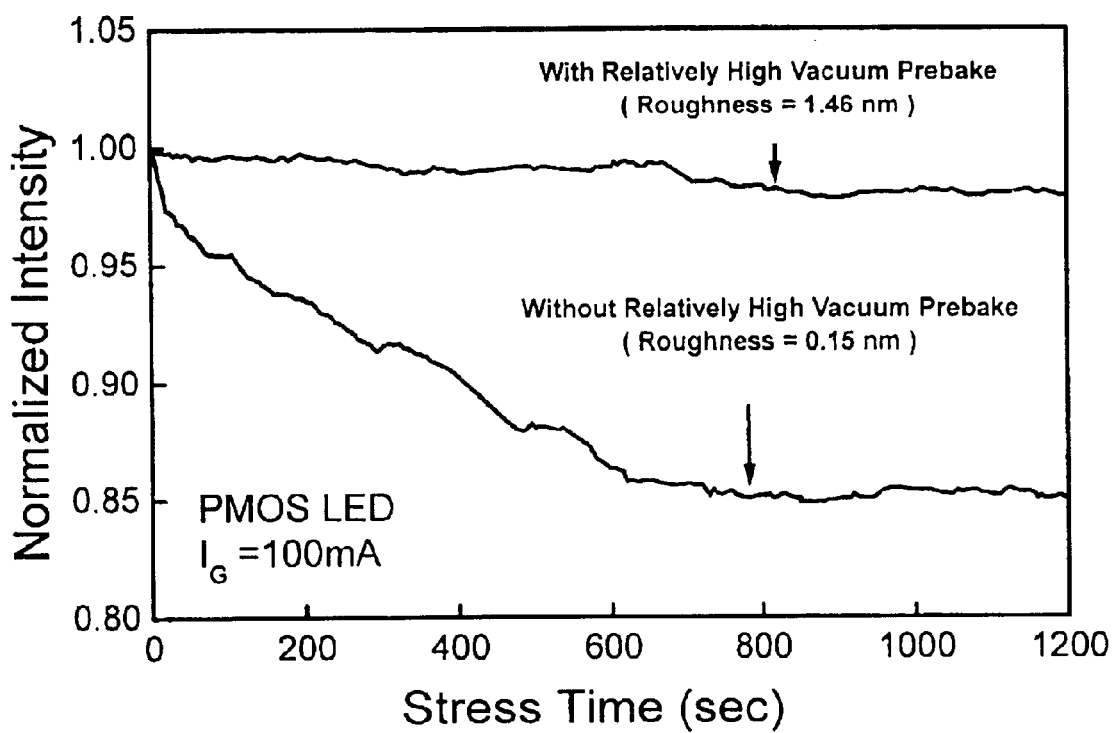
FIG. 6 is the time evolutions of light emission intensity for the rough and flat PMOS LED according to the present invention. The intensity degrades about 15% after 1200 sec stress in the flat PMOS diode. The rough PMOS diode shows much less emission intensity degradation as compared to the flat PMOS diode.
Figure 7:
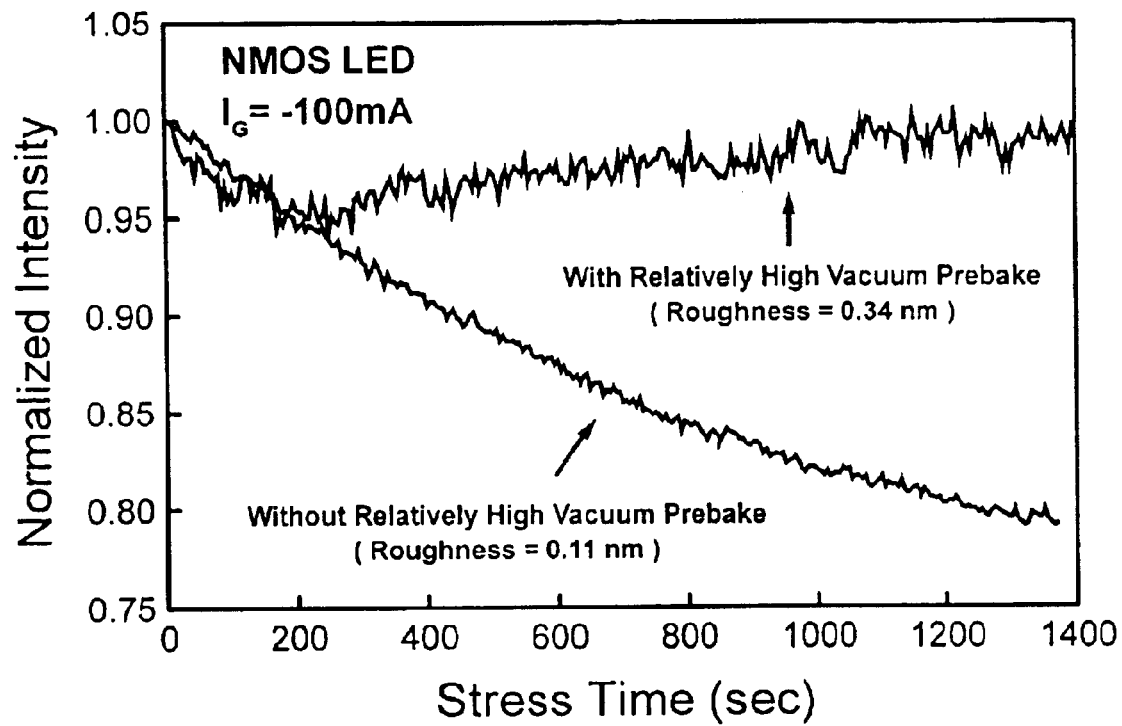
FIG. 7 is the time evolutions of light emission intensity for the rough and flat NMOS LED according to the present invention. The intensity degrades about 20% after 1400 sec stress in the flat NMOS diode. The rough NMOS diode shows much less emission intensity degradation as compared to the flat NMOS diode.

On the other way, the light emission theory of the metal-insulator semiconductor light-emitting diode (MISLED) is that the carrier will tunnel the insulator from the electrode and recombine on the interface between the insulator and the semiconductor to emit the light when the devices are applied with voltage. The light emission intensity will reduce when the devices are used continuously, supposedly attributing to the fact that the increasing of the traps in the interface between the insulator and the semiconductor, the carriers tunneling the insulator are recombined with the traps in the interface between the insulator and the semiconductor and can not emit light any more. Please refer to FIG. 6 showing the relationship between the normalized light emission intensity and the constant voltage stress about the PMOS LED respectively with flat and rough insulators. In FIG. 6, because of too many traps formed in the interface between the insulator and the semiconductor, the light emission intensity of the traditional flat devices reduces about 15% after a period of time, but the devices with relatively rougher surface and interface maintain almost the same intensity. Thus it can be seen that the devices with a relatively more roughness have fewer traps in the interface between the insulator and the semiconductor, this proofs the hypothesis described above. In the NMOS LED, the same situation can be seen (as shown in FIG. 7). Thus, the roughness of the insulator indeed provides a better insulator reliability.

To sum up, prebaking the semiconductor substrate under the relatively very high vacuum and then growing the insulator on it can increase the roughness of the insulator surface and enhance the insulator reliability. On one hand, the operation time of the devices with the same thickness can be increased, and on the other hand, the insulator can be made thinner if the operation time is limited as the same. All these have extremely positive helps to extend international technology roadmap for semiconductor (ITRS), and thus, the present invent owns the value for industrial development.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for utilizing a rough insulator to enhance metal-insulator-semiconductor reliability, comprising steps of:
   (a) providing a semiconductor substrate;
   b) prebaking said semiconductor substrate under a relatively high vacuum with an existence of hydrogen and at a prebaking temperature ranged from 700 to 100° C. so as to form a rough surface on said semiconductor substrate; and
   (c) growing an insulator on said semiconductor substrate to form a rough insulator and increase said metal-insulator-semiconductor reliability when said insulator is applied thereto.

2. A method according to claim 1 wherein said semiconductor substrate is made of a material selected from a group consisting of silicon, germanium, silicon-germanium substrate and III–V group.

3. A method according to claim 2 wherein said semiconductor substrate is made of a material selected from a group consisting of single crystal silicon, polysilicon, amorphous silicon, and epitaxial growth.

4. A method according to claim 1 wherein said semiconductor substrate is one of P-type and N-type.

5. A method according to claim 1 wherein said step (b) is executed at a prebaking pressure less than $10^{-4}$ torr, and a prebaking time ranged from 1 to 60 minutes.

6. A method according to claim 1 wherein said step (c) is executed by a growing method selected from a group consisting of furnace oxidation, rapid thermal oxidation, chemical vapor deposition, and anodic oxidation.

7. A method according to claim 1 wherein said step (c) is formed by reacting with a material selected from a group consisting of gas, liquid, and solid.

8. A method according to claim 1 wherein said insulator is a dielectric.

9. A method according to claim 8 wherein said dielectric is selected from a group consisting of silicon dioxide ($SiO_2$), silicon nitride ($Si_3N_4$), silicon oxynitride ($SiO_xN_y$), and high-K materials.

* * * * *